US009726696B2

(12) United States Patent
Powell et al.

(10) Patent No.: US 9,726,696 B2
(45) Date of Patent: Aug. 8, 2017

(54) PRECISION REFERENCE CIRCUIT AND RELATED METHOD

(71) Applicants: Matthew Powell, Austin, TX (US); David R. Welland, Austin, TX (US)

(72) Inventors: Matthew Powell, Austin, TX (US); David R. Welland, Austin, TX (US)

(*) Notice: Subject to any disclaimer, the term of this patent is extended or adjusted under 35 U.S.C. 154(b) by 1265 days.

(21) Appl. No.: 13/723,417

(22) Filed: Dec. 21, 2012

(65) Prior Publication Data

US 2014/0084899 A1  Mar. 27, 2014

Related U.S. Application Data

(63) Continuation-in-part of application No. 13/624,619, filed on Sep. 21, 2012, now Pat. No. 9,250,137.

(51) Int. Cl.
| | |
|---|---|
| *G01K 7/00* | (2006.01) |
| *G01R 19/00* | (2006.01) |
| *G05F 3/02* | (2006.01) |
| *G01R 35/00* | (2006.01) |
| *G01K 7/01* | (2006.01) |

(52) U.S. Cl.
CPC ........... *G01R 19/0069* (2013.01); *G01K 7/01* (2013.01); *G01R 35/00* (2013.01); *G05F 3/02* (2013.01)

(58) Field of Classification Search
USPC ................................................. 374/178, 170
See application file for complete search history.

(56) References Cited

U.S. PATENT DOCUMENTS

| | | | | |
|---|---|---|---|---|
| 3,940,760 A | * | 2/1976 | Brokaw | H03M 1/0607 327/535 |
| 5,319,370 A | * | 6/1994 | Signore | H03M 1/1047 341/120 |
| 5,440,305 A | * | 8/1995 | Signore | G01K 7/01 341/120 |
| 5,933,043 A | * | 8/1999 | Utsunomiya | H03K 3/356113 326/63 |

(Continued)

OTHER PUBLICATIONS

A. Paul Brokaw, "A Simple Three-Terminal IC Bandgap Reference", pp. 388-393, IEEE Journal of Solid-State Circuits, vol. SC-9, No. 6, Dec. 1974.

(Continued)

*Primary Examiner* — Mirellys Jagan
(74) *Attorney, Agent, or Firm* — Polansky & Associates, P.L.L.C.; Paul J. Polansky

(57) ABSTRACT

In one form, a reference circuit includes a measurement circuit and a determination circuit. The measurement circuit has an output for providing a ratio of a difference in base-to-emitter voltage ($V_{BE}$) of a bipolar device at different current densities to a $V_{BE}$ of the bipolar device at a first current density. The determination circuit has an input coupled to the measurement circuit, and an output for providing a digital value of a parameter in response to the ratio. In another form, the reference circuit further includes a voltage generation circuit having an input coupled to the determination circuit, and an output, for modulating an analog voltage using the digital value to provide a reference voltage to the output, wherein the reference voltage is temperature compensated over a temperature range.

20 Claims, 7 Drawing Sheets

(56) References Cited

U.S. PATENT DOCUMENTS

| | | | | |
|---|---|---|---|---|
| 6,183,131 B1* | 2/2001 | Holloway | ................ | G01K 7/21 327/512 |
| 6,679,628 B2* | 1/2004 | Breinlinger | ............. | G01K 7/01 257/467 |
| 7,236,048 B1* | 6/2007 | Holloway | ................ | G05F 3/30 327/512 |
| 7,309,157 B1* | 12/2007 | Aslan | .................... | G01K 15/00 327/513 |
| 8,092,083 B2* | 1/2012 | Venkataraman | ......... | G01K 7/01 257/470 |
| 2005/0258995 A1* | 11/2005 | Arimura | ............ | H03M 1/0621 341/155 |
| 2007/0164809 A1* | 7/2007 | Fukuda | .................... | G05F 3/30 327/539 |
| 2007/0237207 A1* | 10/2007 | Aslan | .................... | G01K 7/015 374/178 |
| 2009/0108918 A1* | 4/2009 | Chellappa | ................ | G05F 3/30 327/539 |
| 2009/0295458 A1* | 12/2009 | Kameyama | ............ | G05F 3/227 327/512 |
| 2010/0090748 A1* | 4/2010 | Ito | .......................... | G11C 16/30 327/512 |
| 2011/0050470 A1* | 3/2011 | Kimura | ................. | H03M 1/745 341/136 |
| 2011/0062937 A1* | 3/2011 | Werking | .................... | G05F 3/30 323/313 |
| 2011/0200070 A1* | 8/2011 | Makinwa | ............... | G01K 1/024 374/170 |
| 2012/0207190 A1* | 8/2012 | Trampitsch | ........... | G01K 7/015 374/178 |
| 2013/0083825 A1* | 4/2013 | Zhang | ..................... | G01K 7/01 374/178 |
| 2015/0309525 A1* | 10/2015 | Pu | ............................ | G05F 3/30 327/539 |

OTHER PUBLICATIONS

Analog Devices, Inc., "Ultralow Noise, LDO XFET Voltage References with Current Sink and Source", 20 Pages, ADR440/ADR441/ADR443/ADR444/ADR445, Rev. E, Analog Devices, Inc., One Technology Way, P.O. Box 9106, Norwood, MA 02062-9106.

* cited by examiner

US 9,726,696 B2

PRECISION REFERENCE CIRCUIT AND RELATED METHOD

The present application is a continuation-in-part of prior application Ser. No. 13/624,619, filed Sep. 21, 2012, entitled "Temperature Measurement Circuitry and Method", invented by David R. Welland and assigned to the assignee hereof and which is herein incorporated by reference in its entirety.

FIELD OF THE DISCLOSURE

The present disclosure relates generally to reference circuits, and more particularly, to reference circuits providing outputs such as voltages and temperatures.

BACKGROUND

Circuit designers have traditionally used bandgap voltage reference circuits to generate reference voltages that do not vary significantly over an operating temperature range. The output of a bandgap voltage reference circuit is independent of the temperature at which the circuit is operating. For example in data acquisition systems, a voltage reference circuit typically generates a voltage based on a temperature stable bandgap reference since the accuracy of the voltage reference limits the gain accuracy of the system.

Traditional bandgap voltage reference circuits generate a difference in base-to-emitter voltages of two bipolar transistors, known as delta $V_{BE}$ or $\Delta V_{BE}$, which is proportional to absolute temperature (PTAT). The $\Delta V_{BE}$ voltage is added to the base-to-emitter voltage of a single bipolar transistor, which is complementary to absolute temperature (CTAT), to form an output voltage. If the proportional variation with respect to temperature can be made to accurately offset the complementary variation with respect to temperature, then the resulting output voltage will be temperature compensated such that its variation will be small over the operating temperature range. While the output voltage of a bandgap voltage reference circuit is temperature compensated, it can have some variation over temperature due to several imperfections in the circuit. For example, a mismatch between the two transistors forming the $\Delta V_{BE}$ voltage can cause some temperature variation. In addition to some temperature variation, bipolar transistors produce low frequency noise, and the bandgap reference circuit amplifies the noise.

SUMMARY

In an exemplary embodiment, a reference circuit includes a measurement circuit and a determination circuit. The measurement circuit has an output for providing a ratio of a difference in base-to-emitter voltage ($V_{BE}$) of a bipolar device at different current densities to a $V_{BE}$ of the bipolar device at a first current density. The determination circuit has an input coupled to the output of the measurement circuit, and an output for providing a digital value of a parameter in response to the ratio.

In another embodiment, a voltage reference includes a first analog-to-digital converter, a voltage sensor, a multiplier, a first summing device, a digital-to-analog converter, and a buffer. The first analog-to-digital converter has a first input, a second input for receiving an analog base-to-emitter voltage ($V_{BE}$), and an output. The voltage sensor provides a digital signal of representing a digital $V_{BE}$ of a bipolar device. The multiplier has a first input coupled to the output of the first analog-to-digital converter, a second input for receiving the digital signal, and an output. The first summing device has a first input coupled to the output of the multiplier, a second input for receiving a desired voltage, and an output. The digital-to-analog converter has a first input coupled to the output of the first summing device, and an output. The buffer has an input coupled to the output of the digital-to-analog converter, and an output for providing an output voltage coupled to first input of the first analog-to-digital converter.

In yet another embodiment, a method includes alternately operating a bipolar device at a first current density and a second current density, measuring a first base-to-emitter voltage ($V_{BE}$) of the bipolar device at the first current density and a second $V_{BE}$ at the second current density, converting to a digital signal a ratio of a difference between the first $V_{BE}$ and the second $V_{BE}$ divided by one of the first $V_{BE}$ and the second $V_{BE}$, and converting the digital signal to a parameter in response to the ratio.

BRIEF DESCRIPTION OF THE DRAWINGS

The present disclosure may be better understood, and its numerous features and advantages made apparent to those skilled in the art by referencing the accompanying drawings, in which:

FIG. 1 illustrates in schematic form a conventional output buffer;

In the following description, the use of the same reference symbols in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION

Conventionally, diode-connected bipolar transistors can be used to determine a temperature by applying different currents to two different transistors and by measuring the base-emitter voltages to determine a differential voltage. To digitize the differential voltage (ΔVbe), a reference voltage, typically a bandgap voltage (Vbg), is used according to the following equation:

$$\text{Ratio} = \frac{\Delta V_{be}}{V_{bg}} = \frac{\Delta V_{be}}{V_{be} + m * \Delta V_{be}} \quad (1)$$

In Equation 1, the digital result is expressed as a ratio of the differential base-emitter voltage (ΔVbe) relative to the bandgap voltage (Vbg). The bandgap voltage (Vbg) is represented by an equation that includes a parameter (m) that is chosen to minimize or reduce the dependence of the bandgap voltage on the temperature. The differential base-emitter voltage can be expressed according to equation 2 below.

$$\Delta V_{be} = \frac{kT}{q} \ln \frac{J_1}{J_2} \quad (2)$$

In equation 2, variables $J_1$ and $J_2$ are the current densities of the bipolar transistors, k is the Boltzmann constant, T is the absolute temperature, and q is the charge of an electron. Thus, the ratio varies linearly with temperature, because all of the other variables are constant. However, the presence of parameter m in Equation 1 is still a source of error.

Exemplary embodiments described below do not rely on the linearity of the temperature dependence of the ratio. Accordingly, the value of parameter m may be set equal to zero, eliminating a source of error. Further, in addition to eliminating this source of error, the signal-to-noise ratio (SNR) is increased. In particular, since the base-emitter voltage has a negative temperature coefficient, elimination of the influence of parameter (m) increases the sensitivity of the ratio to temperature. Thus, for a given level of noise, the resultant temperature error is reduced. An example of a circuit configured to determine the temperature is described below with respect to FIG. 1.

Figure 1:
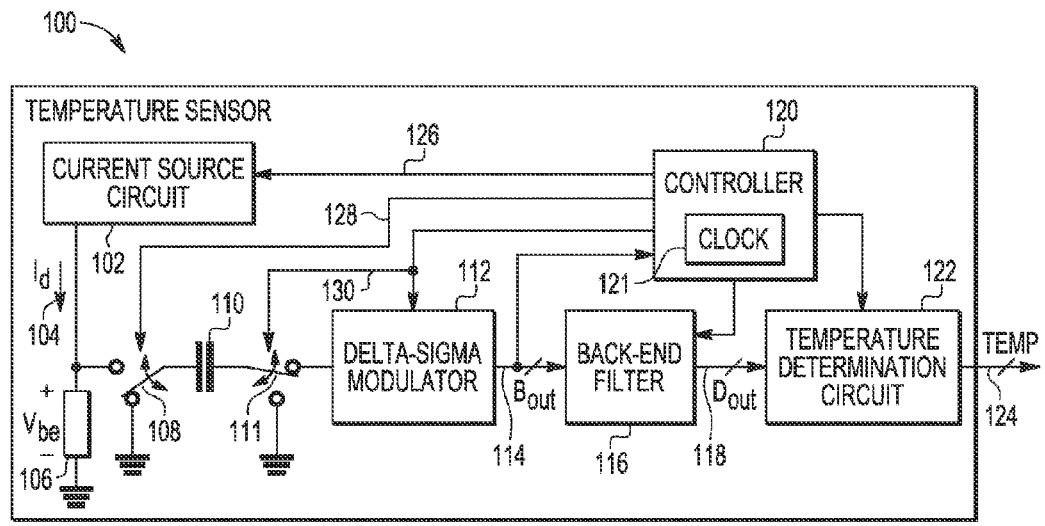
FIG. 1 is a block diagram of an embodiment of a temperature measurement circuitry.

FIG. 1 is a block diagram of an embodiment of temperature measurement circuitry 100. Temperature measurement circuitry 100 could be implemented on an integrated circuit or as part of a larger system such as a system on a chip and the like. Temperature measurement circuitry 100 includes a current source circuit 102 configured to provide a current (Id) 104 to a first terminal of a bipolar device, represented in FIG. 1 as a box identified by reference numeral 106, which has a second terminal coupled to a power supply terminal (ground). In exemplary embodiments, bipolar device 106 may be implemented as a diode having an anode coupled to current source circuit 102 and a cathode coupled to the power supply terminal. In other exemplary embodiments, bipolar device 106 may be implemented using a bipolar transistor. In the following discussion, bipolar device 106 refers to a diode-connected bipolar transistor implementation. However, other embodiments can include another type of bipolar device, such as a junction diode. In various forms, the bipolar device may be implemented in any one of various process technologies, including in a CMOS process, a bi-CMOS process or in a bipolar process.

The first terminal of bipolar device 106 is coupled to a first terminal of a switch 108, which has a second terminal coupled to a terminal of a capacitor 110. Switch 108 has a third terminal coupled to a power supply terminal, which may be at a supply voltage such as ground potential. Capacitor 110 has a second terminal coupled to a first terminal of a switch 111, which has a second terminal coupled to an input of a delta-sigma modulator 112, and a third terminal coupled to a power supply terminal, which may be ground. The power supply terminal coupled to switch 108 may be at a different voltage potential than the power supply terminal coupled to switch 111, depending on the implementation.

Delta-sigma modulator 112 includes an output 114 coupled to an input of a back-end filter 116. Back-end filter 116 has an output 118 coupled to an input of a temperature determination circuit 122. Current source circuit 102, switch 108, switch 111, delta-sigma modulator 112, back-end filter 116, and temperature determination circuit 122 have control inputs coupled to a controller 120 to receive control signals.

Controller 120 is configured to control current source circuit 102 via one or more current control signals 126 to provide a time-varying current (Id 104) to the first terminal of bipolar device 106, producing a time-varying base-emitter voltage (Vbe) across the base-emitter junction of bipolar device 106, which in this exemplary embodiment is implemented using a bipolar transistor. Controller 120 also controls switch 108 via switch control signal 128 to provide the time-varying base-emitter voltage to capacitor 110. Controller 120 further controls switch 111 and delta-sigma modulator 112 via control signal 130 to provide a charge proportional to the time-varying base-emitter voltage to the input of delta-sigma modulator 112, dumping the charge from capacitor 110 into delta-sigma modulator 112 via control signal 130. In some embodiments, controller 120 includes a clock circuit 121, and control signal 130 may be a clock signal.

Delta-sigma modulator 112 produces a one-bit output signal ($B_{out}$) 114, which is provided to back-end filter 116. Back-end filter 116 produces a filtered multi-bit output signal $D_{out}$ 118, which is provided to temperature determination circuit 122, which is configured to determine a temperature value based on the filtered output signal $D_{out}$ 118 and to provide a multi-bit output signal labeled "Temp" corresponding to the temperature value. In some embodiments, temperature determination circuit 122 includes a programmable, polynomial machine configured to receive the filtered output signal $D_{out}$ 118 and to calculate the temperature based on the signal. In a particular example, the polynomial machine processes the filtered output signal $D_{out}$ 118 based on the pre-programmed coefficients of the polynomial. In other exemplary embodiments, temperature determination circuit 122 includes a lookup table configured with a plurality of temperature values and is configured to determine the temperature from the lookup table based on the filtered output signal $D_{out}$ 118. In the above examples involving the polynomial or the table, temperature determination circuit 122 compensates for the non-linear nature of the ratio as a function of the temperature.

In some embodiments, controller 120 controls current source circuit 102 by using signal 126 to selectively couple one or more of a plurality of unit current sources from current source circuit 102 to the first terminal of bipolar device 106. The unit current sources are sized to provide the same currents, but the unit currents may vary slightly due to non-idealities. When controller 120 controls current source circuit 102 to couple a selected one of the plurality of unit current sources to the first terminal of bipolar device 106, a relatively low current is provided, producing a relatively low base-emitter voltage ($V_1$). When controller 120 controls current source circuit 102 to couple all of the plurality of unit current sources to the first terminal of bipolar device 106 at the same time, a relatively high current is provided, producing a relatively high base-emitter voltage ($V_2$).

In operation, controller 120 controls the plurality of unit current sources of current source circuit 102 alternately to couple at least some of the plurality of unit current sources to the first terminal to provide the relatively high current and to couple a selected one of the plurality of unit current sources to the first terminal to provide the relatively low current to the first terminal. In each modulator cycle, controller 120 controls current source circuit 102 to provide the relatively low current in a first phase and to provide the relatively high current in a second phase. The terms "first" and "second" in this discussion are not intended to imply a particular order, but rather to distinguish between the phases. During the first phase, controller 120 selects one of the plurality of unit current sources, cycling through the unit current sources from modulator cycle to modulator cycle by rotating through the multiple unit current sources.

Due to mismatches, individual ones of the plurality of unit current sources may provide a current level that differs from that of other unit current sources. However, the variations can be averaged to provide a unit current whose value is 1/Nth of the sum of the (N) unit current sources.

In an exemplary embodiment, the current source circuit 102 includes sixteen unit current sources, and controller 120 controls the unit current sources to provide a ratio of 16 to 1 between the relatively high current level and the relatively low current level, resulting in a relatively high base-emitter voltage ($V_2$) and a relatively low base-emitter voltage ($V_1$), respectively. By rotating through the sixteen unit current sources (i.e., successively activating different ones of unit current sources), the relatively low current level may have sixteen slightly varied current levels due to mismatches. In the presence of this kind of mismatch, the effects may be averaged to provide relatively low current that is approximately 1/16th of the relatively high current. Using a single bipolar device 106 and varying the diode current ($I_d$) 104 in this manner provides a temperature dependent differential voltage that can be used to determine a temperature while eliminating diode mismatch errors.

The time-varying current mimics switching between two diodes having different base-emitter voltages. Controller 120 controls switch 108 to selectively couple the first terminal of capacitor 110 to the first terminal of bipolar device 106 or to ground, and controls switch 111 to selectively couple the second terminal of capacitor 110 to ground or to the input of modulator 112. In particular, controller 120 controls switch 108 based on the output Bout 114 of the delta-sigma modulator 112. In some embodiments, controller 120 may be a state machine, although generally any suitable circuit that provides sequential logic functionality may be used, as persons of ordinary skill in the art understand. One possible example of switching states of capacitor 110 is described below in Table 1. For the example of Table 1, current source circuit 102 includes 16 unit current sources that are independently controllable to supply a selected one of the unit currents (Ii during phase 1) or all of the unit currents (I1-16 during phase 2) to the first terminal of bipolar device 106.

TABLE 1

Switching States of Switched Capacitor 110 during a modulator cycle.
Switching States during each modulator cycle

|  | Phase 1 | Phase 2 |
| --- | --- | --- |
| Unit Current Source(s) | $I_i$ of 16 unit currents (I) | Total Unit Currents ($I_{1-16}$) |
| Switch 111 | Ground | Provide Capacitor Charge to Modulator |
| Switch 108 | $V_1$ | If $B_{out}$ 114 = 0, then $V_2$ If $B_{out}$ 114 = 1, then ground |

As shown in Table 1, during a first phase (or first portion) of the modulator cycle, controller 120 controls current source circuit 102 to provide a single unit current ($I_i$) from a selected one of the unit current sources to the first terminal of bipolar device 106. Controller 120 controls switch 111 to couple to ground and controls switch 108 to couple to the first terminal of bipolar device 106. During the second phase of the modulator cycle, controller 120 controls current source circuit 102 to provide all of the unit currents (I1-16) to the first terminal of bipolar device 106. Controller 120 also controls switch 111 to couple to the input of modulator 112 to provide the charge from capacitor 110 into modulator 112. During this phase, controller 120 controls switch 108 to remain coupled to the first terminal of bipolar device 106 to receive the second voltage ($V_2$) if the output of the modulator 112 from the previous modulator cycle was a zero (0). If the output of modulator 112 was a one (1) from the previous modulator cycle, controller 120 controls switch 108 to couple to ground.

In the next modulator cycle, during the first phase, controller 120 selects a next one of the unit current sources and provides the associated unit current ($I_i$) to the first terminal of bipolar device 106. During the second phase, controller 120 controls current source circuit 102 to provide all of the unit currents to the first terminal of bipolar device 106. These phases are repeated for each modulator cycle.

Over time, the delta-sigma modulator 112 operates to balance the charge and the back-end filter operates to average the one-bit outputs ($B_{out}$) to obtain the output ($D_{out}$) such that the output averages to approximately zero as shown in the following equation.

$$(V_1-V_2)(1-D)+DV_1=0 \qquad (3)$$

where (D) is the long-term average of the one-bit outputs ($B_{out}$) from the back-end filter 116. Equation 3 can be rewritten as shown in the following equation.

$$V_1=V_2(1-D) \qquad (4)$$

Solving for the long-term average (D), equation 4 can be rewritten as shown in the following equation.

$$D = \frac{V_2 - V_1}{V_2} \qquad (5)$$

As discussed above, the variations in the unit currents due to mismatches cause variations in the resulting base-emitter voltages at the relatively low voltage level. However, such variations are averaged by the back-end filter 116 to provide the equivalent of a current ratio of 1 to 16, assuming 16 current sources are used. The ratio could be a different ratio if a subset of the unit current sources is used (such as 8 of the 16 unit current sources) or if a larger number of unit current sources are used.

In the discussion above, current source circuit 102 is depicted as being connected to the first terminal of bipolar device 106. In some instances, current source circuit 102 may be coupled to the cathode of bipolar device 106 instead, and the first terminal may be coupled to a power supply terminal.

In general, to mimic operation of two diodes having different currents, controller 120 controls current source circuit 102 to provide a time-varying current (Id(t)) to a first terminal of bipolar device 106. An exemplary embodiment of a portion of a current source circuit 102 that is controllable to provide a time-varying current is described below with respect to FIG. 2.

Figure 2:
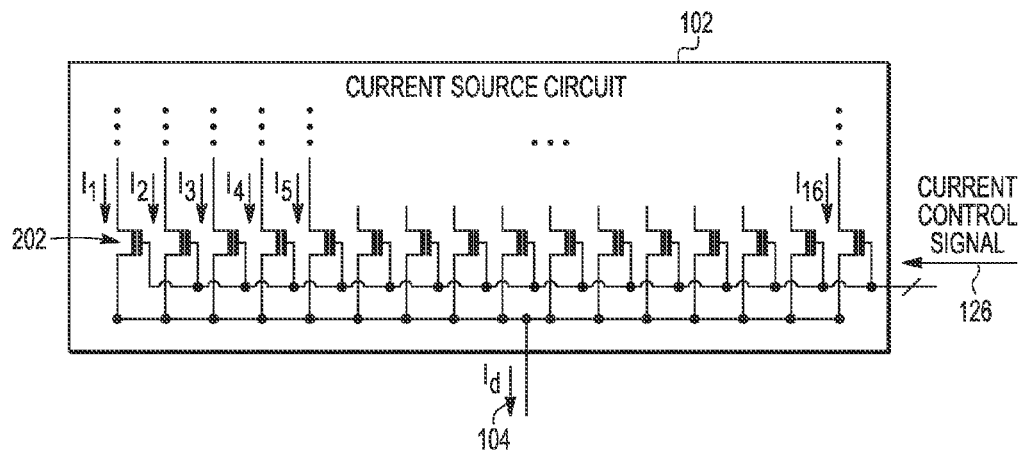
FIG. 2 is a circuit diagram of an embodiment of a portion of a current source circuit that is configured to selectively supply one or more of a plurality of currents to a terminal of a bipolar device.

FIG. 2 is a circuit diagram of an embodiment of a portion of current source circuit 102 of FIG. 1 that is configured to selectively couple one or more of a plurality of currents to the first terminal of bipolar device 106. In this example, current source circuit 102 includes a plurality of transistors generally indicated at Each transistor has a source coupled to a current source, a gate coupled to controller 120, and a drain coupled to the first terminal of bipolar device 106. Each transistor has an associated current $I_2$, $I_3$, $I_4$, $I_5$, . . . , or $I_{16}$), which can be selectively coupled to the first terminal of bipolar device 106 in response to current control signal(s) 126. While the connection between controller 120 and current source circuit 102 in FIG. 1 is shown as a single line, multiple independent connections may be used. In particular, each transistor 202 can be independently controlled, allowing controller 120 to control current source circuit 102 to selectively supply one or more of the currents to the first terminal of bipolar device 106. In the embodiment shown, 16 current sources are used, although other numbers of current sources may be used by making appropriate modifications, as persons of ordinary skill in the art understand.

In an example, in a first phase, controller 120 provides current control signals 126 to bias a selected one of the transistors 202 to provide one of the unit currents ($I_1$, $I_2$, . . . , $I_{16}$). In the second phase, controller 120 provides current control signals 126 to bias all of the transistors 202 to provide all of the unit currents to the first terminal of bipolar device 106. Over a sequence of modulator cycles, controller 120 selectively activates a selected one of the transistors 202 during a first phase to provide a selected unit current (one of $I_1$, $I_2$, $I_3$, . . . , $I_{16}$) and some or all of the transistors 202 during a second phase to provide a total current ($I_{1-16}$). Over time, the current provided to the first terminal is time-varying (e.g., $I_1$, $I_{1-16}$, $I_2$, $I_{1-16}$, . . . ). From modulator cycle to modulator cycle, controller 120 rotates through the drain currents (or collector currents if implemented using bipolar transistors), selectively activating a different one of the transistors 202 during the respective first phases of each modulator cycle as depicted below with respect to FIG. 3.

Figure 3:
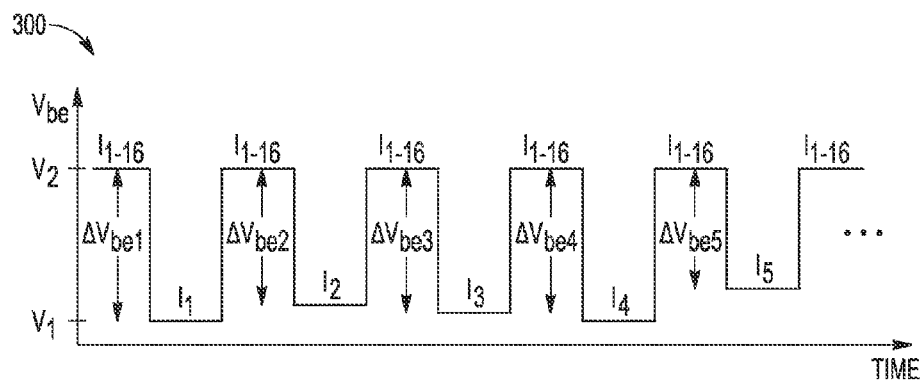
FIG. 3 is a diagram of an exemplary embodiment of a voltage caused by a time-varying current from the current source circuit of FIG. 2.

FIG. 3 is a diagram 300 of an example of a time-varying voltage 302 caused by a time-varying current 104 from current source circuit 102 of FIGS. 1 and 2. During a first phase, a selected one of transistors 202 is biased to conduct current ($I_t$) and during a second phase, a set (such as all) of transistors 202 is biased to conduct current (such as $I_{1-16}$). In this example, unit currents $I_1$ and $I_4$ are approximately equal, and unit currents $I_2$, $I_3$, and $I_5$ differ from currents $I_1$ and $I_4$ and from each other. As shown, as the current supplied to the diode ($I_d$) varies between the relatively high current and the relatively low current, the corresponding base-emitter voltage oscillates between a relatively high base-emitter voltage ($V_2$) and a low base-emitter voltage ($V_1$). The low base-emitter voltage ($V_1$) varies based on the selected current source, which variations may be caused by mismatches. By switching between the single unit current and all (or a subset) of the unit currents, differential base-emitter voltages ($\Delta V_{be}$) are generated. In this example, the base-emitter voltages are slightly different; however, they can be averaged by back-end filter 116 over time to provide an average differential base-emitter voltage.

While the above examples describe alternating between a unit current and a plurality of unit currents applied to the first terminal of bipolar device 106, DC impairments, such as amplifier offsets, charge injection, and 1/f noise (for example), can still provide some problems. However, temperature measurement circuitry 100 can avoid the DC impairments by making the differential base-emitter voltage vary periodically. In this exemplary embodiment, the back-end filter 116 can then be implemented as a band-pass filter, rather than low-pass filter, thus eliminating DC impairments. In this particular example, in a first plurality of modulator cycles, the front-end operates as described above. In a second plurality of modulator cycles, the total current ($I_{1-16}$) is provided to the bipolar device 106 during both phases of each modulator cycle. This effectively converts the value of the differential base-emitter voltage into a square wave over the two pluralities of modulator cycles.

In general, the input square wave period includes a plurality of modulator cycles including a first plurality of modulator cycles and a second plurality of modulator cycles. In the first plurality of modulator cycles, the current supplied to bipolar device 106 varies between a single unit current ($I_t$) in a first phase and a total unit current ($I_{1-16}$) in a second phase. In the second plurality of modulator cycles, the current supplied to bipolar device 106 does not vary between the first phase and the second phase of each modulator cycle. In a particular example, the current supplied to bipolar device 106 is the total unit current ($I_{1-16}$) for both phases for each of the second plurality of modulator cycles.

Referring again to Equation 5 above, during the first plurality of modulator cycles, the digital output is the ratio of the difference between the voltage ($V_2$) when the total unit current ($I_{1-16}$) is provided to bipolar device 106 and the voltage ($V_1$) when a selected unit current ($I_t$) is provided to bipolar device 106 divided by the voltage ($V_2$). During the first plurality of modulator cycles, the digital output is a ratio value that is not equal to zero. During the second plurality of modulator cycles, the difference between the voltage ($V_1$) and the voltage ($V_2$) is zero, because the total unit current ($I_{1-16}$) is supplied to bipolar device 106 during both phases of each modulator cycle. Thus, the delta-sigma modulator 112 operates to convert the voltage from bipolar device 106 into a square wave.

In some exemplary embodiments, the input square wave period is 256 modulator cycles, the first plurality of modulator cycles includes 128 modulator cycles, and the second plurality of modulator cycles includes 128 modulator cycles. In other examples, the input square wave period may include fewer modulator cycles or more modulator cycles. In general, the number of modulator cycles may be determined by the specifics of a particular implementation, such as the size of memory needed to store the digital values of the impulse response of the back-end filter 116 as will be described below. Additionally, a measurement period or measurement taken by temperature measurement circuitry 100 may include multiple input square wave periods. In an example, the number of input square wave periods may be programmable, such as by setting a value in a register or memory (not shown). An increased number of sampling periods increases the power consumption but also improves the signal-to-noise ratio. In an example, three input square wave periods may be used to determine the temperature.

In an example, the delta-sigma modulator 112 can be implemented as having a band-pass characteristic. However, a band-pass response may produce an output signal having DC effects, quantization noise, and other noise (such as thermal noise) that can be removed by back-end filter 116. In some exemplary embodiments, the back-end filter 116 may be implemented to convolve the output of modulator 112 with a sine wave to filter the noise. However, an abrupt start and stop of the sine wave increases quantization noise. Accordingly, the sine wave is windowed at the beginning and end to soften the transitions, reducing quantization noise. One possible example of a back-end filter configured to remove such noise is described below with respect to FIG. 4.

Figure 4:
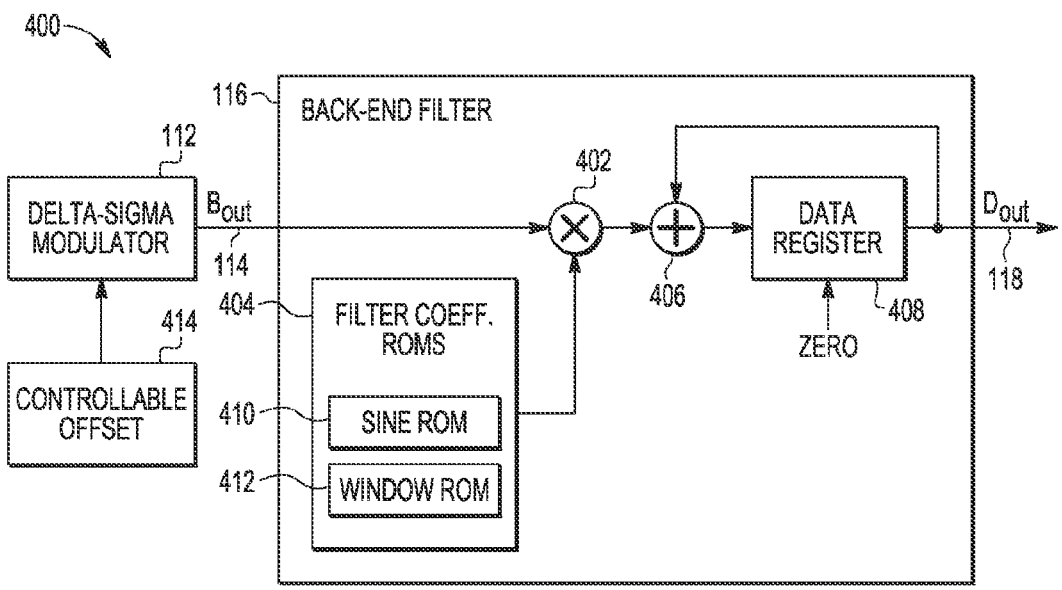
FIG. 4 is a block diagram of a portion of the temperature measurement circuitry of FIG. 1 including a back-end filter.

FIG. 4 is a block diagram of a portion 400 of the temperature measurement circuit 102 of FIG. 1 including back-end filter 116. Back-end filter 116 includes an input terminal coupled to an output terminal of delta-sigma modulator 112 to receive the modulator output signal ($B_{out}$) 114. Back-end filter 116 includes a multiplier 402 having a first terminal coupled to the input, a second terminal coupled to filter coefficient ROMs 404 (or generally other suitable storage device or circuit, as persons of ordinary skill in the art understand), and an output terminal coupled to an input terminal of an adder 406. Adder 406 includes a second input terminal for receiving data output signal ($D_{out}$) 118 and an output terminal coupled to an input terminal of a data register 408, including an input terminal for receiving a zero signal and an output terminal for providing data output signal ($D_{out}$) 118. Filter coefficient ROMS 404 include sine ROM (SROM) 410 configured to store bit values corresponding to a first quadrant of a sine wave and a windowing ROM (WROM) 412 configured to store bit values corresponding to a windowed version of the sine wave. Since the modulator output (Bout) is a single bit value, the multiplication operation is trivial. Further, one filter output sample is used to report the temperature, so no memory other than that in data register 408 is used. In exemplary embodiments, rather than using ROMs, other suitable storage circuits or devices may be used, for example, flash memory, EEPROM, etc., as persons of ordinary skill in the art understand. By using re-writable storage devices, the characteristics of the back-end filter 116 may be changed or programmed, as desired, for example, by the user of the device.

In an example, portion 400 includes a controllable offset source 414. Controller 120 can cause controllable offset source 414 to intentionally introduce an offset by injecting a fixed amount of charge into delta-sigma modulator 112 with each cycle. In some exemplary embodiments, the offset voltage may be intentionally introduced, for example, to center the AC waveform of the transfer function of delta-sigma modulator 112 (for example, away from extremes). While controllable offset source 414 is depicted as providing an offset signal directly to delta-sigma modulator 112, in some implementations, controllable offset source 414 may provide the offset charge directly to the input coupled to the second terminal of switch 111 in FIG. 1.

In general, an idealized filter may enhance the signal-to-noise ratio (SNR), depending on the type of input noise (e.g., quantization noise, thermal noise, etc.). In exemplary embodiments, back-end filter 116 may be designed to represent a compromise between a filter optimized for suppression of quantization noise and a filter optimized for suppression of thermal noise. Since quantization noise can be suppressed by increasing an oversampling ratio of delta-sigma modulator 112, back-end filter 116 may be slanted toward filtering of thermal noise. Such a filter may be called a "matched filter." In such a scenario, symbols or signal values are transmitted in the presence of noise, and a matched filter has an impulse response that is the time reversal of the transmitted symbols in order to maximize SNR in the presence of white noise, such as thermal noise. The output of the filter can be obtained by convolving the input signal with the filter impulse response. In this example, the filter output is maximized at the time when the time-reversed impulse response aligns with the symbol itself.

With a matched filter, the convolution multiplies the signal by a larger number when the signal is large and by a small number when the signal is small (thereby multiplying noise by a small number). In this example, the symbol is a square wave of alternating values of the base-emitter voltage ($\Delta V_{be}$) and of zeros, so a matched back-end filter would have a square-wave impulse response. However, while a matched filter would be optimal in the presence of white noise alone, the matched filter's response to quantization noise may be unacceptable. In particular, square wave harmonics and the finite duration (abrupt beginning and ending) of the time-varying base-emitter voltage signal can lead to relatively poor suppression of quantization noise. A compromise filter can be obtained by passing the fundamental frequency of the input square wave, which contains approximately 81% of the square-wave energy and by windowing the response to smooth start and stop transients, as noted above.

The non-windowed impulse response of the back-end filter 116 is then simply a sine wave. In some embodiments, one quadrant of the sine wave is stored in SROM 410. The other quadrants of the sine wave may be created by time-reversing and/or inverting the readout order of the SROM data words. The first period of the sine wave is softened (windowed) by multiplying the non-windowed values by a raised cosine. These modified (softened) values are stored in WROM 412. WROM 412 can have four times the size or more of the SROM 410 because, instead of storing the one quadrant of the sine wave, the WROM 412 may be sized to store at least four quadrants of the windowed sine wave. The windowed and non-windowed portions of the impulse response can be combined to provide an impulse response.

In some exemplary embodiments, temperature measurement circuitry 100 operates at a clock frequency of approximately 1 MHz. The square wave signal represented by the time-varying base-emitter voltage ($\Delta V_{be}$) can be sampled any number of times. In an example, the controller 120 may be configured to control back-end filter 116, current source circuit 102, and switches 108 and 111 to sample the voltages a programmable number of times. In an example, the number of square waves to be sampled can be selected to be between 3 and 257, in the latter case using an impulse response of 255 sine wave periods plus two periods that are windowed sine waves (one at the beginning and one at the end). In general, the measurement period of the modulator 112 may include any number of modulator cycles. Back-end filter 116 may apply any (programmable) number of periods of a sine wave to filter the data sample. Using more sine wave periods results in increased power consumption but also enhanced SNR.

In an example, the overall response of back-end filter starts with the values stored in WROM 412. After the values are read out of the WROM 412, the values are read out of SROM 410. In some exemplary embodiments, the values are read out of the SROM 410 in a first order, then read out again in a second order, the read out a third time in the first order and inverted, and finally read out again in the second order and inverted to produce a sine wave. The duration of the impulse response of back-end filter 116 is selectable. A longer duration improves the signal-to-noise ratio. The SROM 410 is read continuously, cycle-after-cycle, as long as desired (based on the selected duration). The WROM 412 is finally read to end the response, this time in reverse order and with its data inverted. An example of the impulse response and the resulting frequency response are described below with respect to FIGS. 5A and 5B.

Figure 5A:
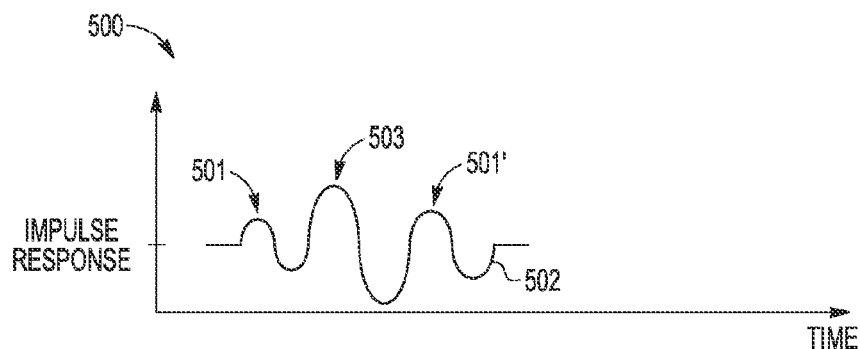
FIG. 5A is a diagram of an impulse response over time stored in a read-only memory (ROM) of a back-end filter of the temperature measurement circuitry of FIGS. 1-4.

FIG. 5A is a diagram 500 of an impulse response signal over time stored in a ROM of a back-end filter of the temperature measurement circuitry of FIGS. 1-4. The impulse response 502 has a windowed portion 501, which is read from WROM 412, and a non-windowed portion 503, which is read from SROM 410, followed by a second windowed portion 501', which is the reverse of the windowed portion 501. In this example, a duration of one sine wave is programmed, providing one full sine wave (non-windowed portion 503) and two windowed portions 501 and 501'. By windowing the sine wave at the beginning and the end, quantization noise effects are reduced relative to a sine wave with abrupt starts and stops.

Figure 5B:
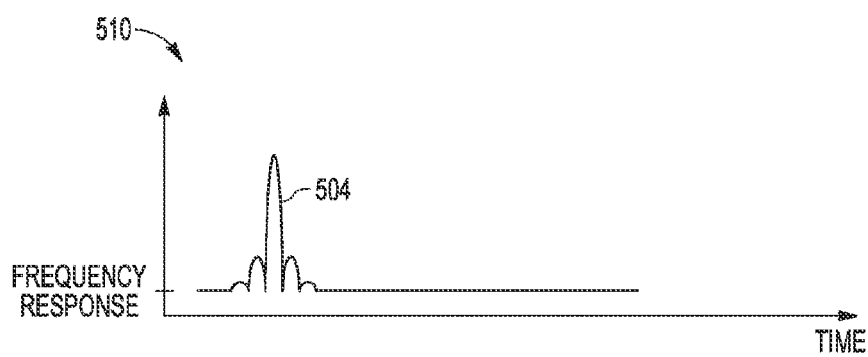
FIG. 5B is a diagram of a frequency-domain representation of the impulse response of the back-end filter of FIG. 5A.

FIG. 5B is a diagram of a frequency response 510 corresponding to the impulse response 500 of the back-end filter 116 of FIG. 5A. Frequency response 510 has a peak 504 at a fundamental frequency and quickly falls off with limited energy at harmonics of the fundamental frequency.

Figure 6:
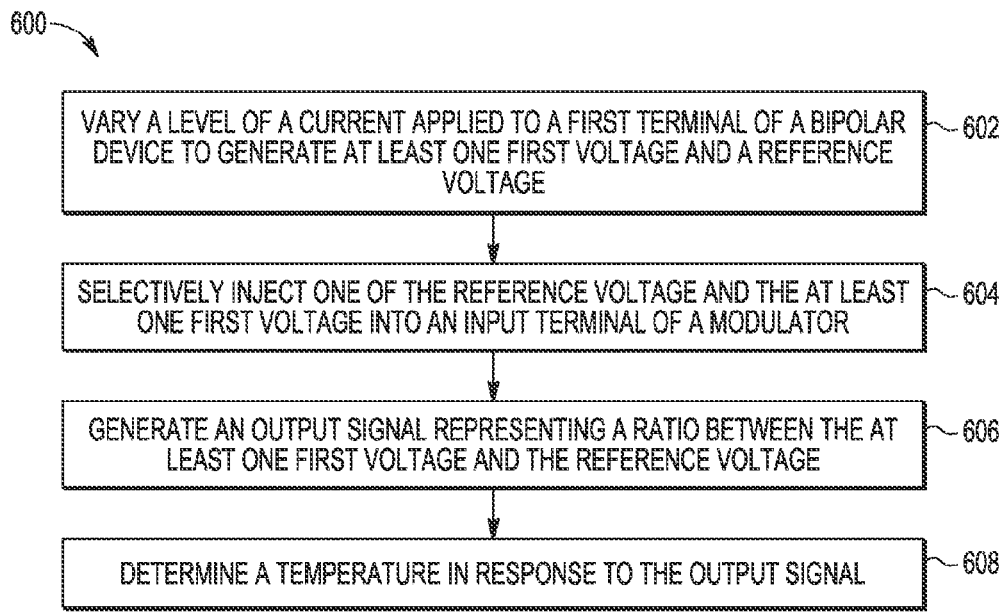
FIG. 6 is a flow diagram of an embodiment of a method of determining a temperature using the temperature measurement circuitry of FIG. 1.

FIG. 6 is a flow diagram of an embodiment of a method 600 of determining a temperature using the temperature measurement circuitry of FIG. 1. At 602, a level of a current applied to a first terminal of a bipolar device is varied to generate a reference voltage and at least one second voltage. In an exemplary embodiment, the current level is varied by alternately coupling a plurality of current sources and a selected one of the plurality of current sources to the first terminal to produce the reference voltage and the least one second voltage, respectively. The plurality of current sources may be unit current sources. In exemplary embodiments, when all of the plurality of current sources are activated, a relatively high reference current is provided to first terminal of the bipolar device, such as the first terminal of bipolar device 106, producing a correspondingly high diode voltage. When one of the current sources is activated and the rest turned off, a relatively low current is provided, producing a correspondingly low base-emitter voltage. In this particular example, the method 600 further includes alternating between the relatively high current and the relatively low current, successively activating the unit current sources to produce the at least one second voltage.

Advancing to 604, one of the reference voltage and the at least one second voltage are selectively injected into an input of a modulator. In some exemplary embodiments, a capacitor could be used to couple the modulator input to the first terminal of the bipolar device. In exemplary embodiments, the reference voltage and the at least one second voltage are selectively injected into the modulator through a capacitor, which includes a first terminal coupled to the first terminal of the bipolar device through a first switch and a second terminal coupled to the input of the modulator through a second switch. Continuing to 606, an output signal is generated that represents a ratio between the first voltage and the at least one second voltage. In an exemplary embodiment, the modulator, which is a delta-sigma modulator, generates the output signal by providing a one-bit output representing one of the one or more ratios to a back-end filter, which includes an accumulator. The one-bit output is convolved with an impulse response signal at the accumulator (back-end filter 116) to produce a resulting value, and the resulting value is provided to a temperature determination circuit 122 to determine a temperature. Convolving the one-bit output with an impulse response includes retrieving stored values from at least one memory to produce a sine wave representing the impulse response feedback signal. In some exemplary embodiments, retrieving stored values includes retrieving first values of the sine wave from a first memory (first windowed portion), retrieving second values of the sine wave from a second memory iteratively for a pre-determined period of time (non-windowed, sine wave portion), and retrieving the first values (windowed portion) of the sine wave from the first memory in reverse order and inverted to produce an impulse response.

Proceeding to 608, a temperature is determined in response to the output signal. In exemplary embodiments, temperature determination circuit 122 determines the temperature based on the output of the back-end filter 116. In one embodiment, temperature detection circuit 122 is a polynomial machine configured to calculate the temperature based on the output of the back-end filter 116. In another embodiment, temperature detection circuit 122 includes a lookup table that is pre-populated with temperature values that can be retrieved based on the output of the back-end filter to determine the temperature. In a particular example, the temperature lookup table 122 may be populated with temperature values based on temperature lab measurements of first silicon.

In some embodiments, temperature determination circuit 122 may be a programmable polynomial machine configured to calculate a temperature based on the output of the back-end filter 116. In exemplary embodiments, the coefficients for the polynomial used by temperature determination circuit 122 may be programmed based on a calibration process and/or based on measurements of first silicon at manufacturing.

In an alternative embodiment, the temperature determination circuit 122 may include lookup logic and a lookup table configured to retrieve a temperature value in response to the signal from the back-end filter 116. If the repeatability of the differential base-emitter voltage ($\Delta V_{be}$) is sufficiently robust, no test floor temperature control or measurement will be needed, depending on the desired specifications for a particular implementation. In some exemplary embodiments, an external high-accuracy digital volt meter (DVM) can be used to measure the base-emitter voltage ($V_{be}$), which may be in error before calibration. A high signal-to-noise ratio (SNR) digital output can be obtained indicating the ratio of the differential base-emitter voltage ($\Delta V_{be}$) to the base-emitter voltage ($V_{be}$). The value of the differential base-emitter voltage can then be derived, which value indicates the temperature as described above with respect to equation 2. The correct value of the base-emitter voltage at each temperature is known a priori from measurements taken from a first batch of fabricated integrated circuits (ICs) (i.e., first silicon). An adjustment to the reference current can thus be made to obtain the correct base-emitter voltage for the temperature. If the differential base-emitter voltage is sufficiently robust within a particular lot of fabricated ICs, but not between lots, it may be possible to obtain the differential base-emitter voltage versus temperature characteristic on a lot-to-lot basis.

In the above discussion, the terms "first" and "second" are used to differentiate between different voltages or currents; however, the terms do not necessarily imply timing. In the example of block 602 in FIG. 6, the at least one second voltage may be produced during a first phase of a modulator cycle while the first voltage may be produced during a second phase of the modulator cycle.

Figure 7:
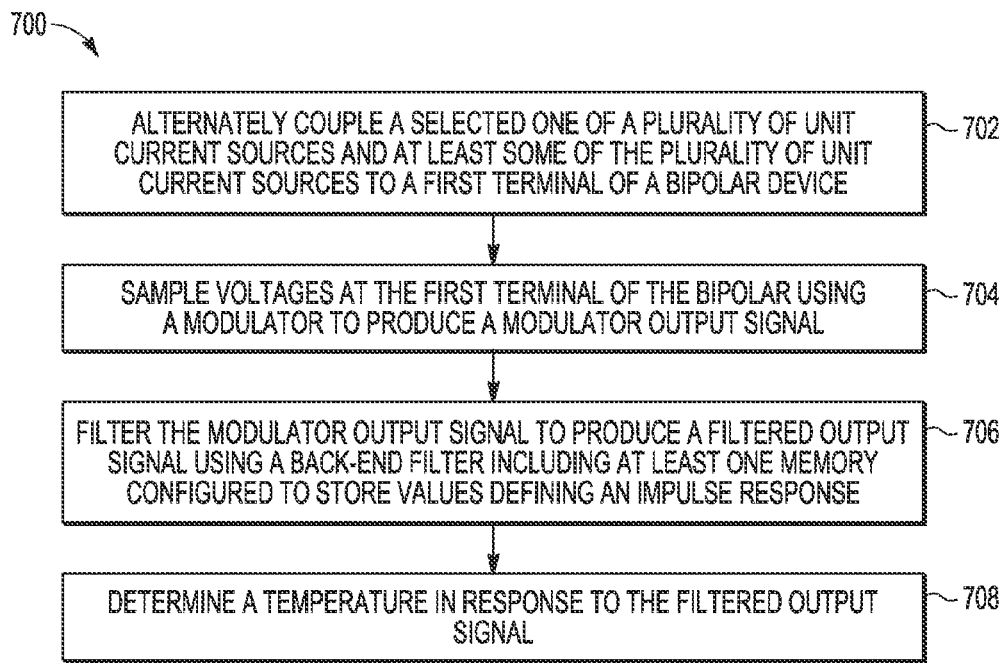
FIG. 7 is a flow diagram of a second embodiment of a method of determining a temperature using the temperature measurement circuitry of FIG. 1.

FIG. 7 is a flow diagram of a second embodiment of a method 700 of determining a temperature using the temperature measurement circuitry of FIG. 1. At 702, controller 120 of temperature measurement circuitry 100 controls a current source circuit 102 to alternately couple a selected one of a plurality of current sources and at least some of the plurality of current sources to a first terminal of a bipolar device, such as bipolar device 106. In exemplary embodiments, the plurality of current sources are unit current sources. In some exemplary embodiments, the controller alternately couples the selected one of the plurality of unit current sources and the some of the plurality of unit current sources to the first terminal in different phases of a modulator cycle. In a first phase, the controller selects one of the plurality of unit current sources and couples the selected one of the plurality of unit current sources to the first terminal to produce a first voltage. In a second phase, the controller couples a set of the plurality of unit current sources to the first terminal to produce a second voltage. The set may include all of the unit current sources. The method further includes iteratively repeating the first and second phases during at least a portion of a sampling period including a plurality of modulator cycles.

Advancing to 704, a modulator 112 samples voltages at the first terminal of the bipolar device to produce a modulator output signal. In exemplary embodiments, sampling the voltages includes controlling a first switch to couple a terminal of a capacitor to ground during a charge capture phase and to couple the terminal to an input of the modulator during a sample phase. Further, sampling the voltages includes controlling a second switch to couple a second terminal of the capacitor to the first terminal of the diode during the capture phase and to selectively couple the second terminal to one of ground and the first terminal during the sample phase based on a value of the modulator output signal. In exemplary embodiments, when the value of the modulator output signal is zero, the second terminal of the capacitor is coupled to the first terminal and, when the value of the modulator output signal is one, the second terminal of the capacitor is coupled to ground.

Continuing to 706, the modulator output signal is filtered to produce a filtered output signal using a back-end filter including at least one memory configured to store values defining an impulse response. The impulse response includes a periodic signal having a first windowed portion, a non-windowed portion, and a second windowed portion. In exemplary embodiments, the modulator output signal is filtered by convolving the modulator output signal with the impulse response to produce the filtered output signal. Such convolution can include reading a first set of values from a memory in a first order to form the first windowed portion, reading a second set of values from the memory in the first order to form a first quadrant of a sine wave of the non-windowed portion, and selectively reversing and inverting the second set of values to form second, third, and fourth quadrants of the sine wave. Further the convolution may include reversing the first order of the first set of values and inverting the first set of values to form the second windowed portion.

Proceeding to 708, a temperature is determined in response to the filtered output signal. In some exemplary embodiments, the temperature is determined by calculating the temperature by processing values from the filtered output signal using a polynomial machine. In another example, the temperature is determined by retrieving a temperature from a lookup table based on at least one value of the filtered output signal.

In conjunction with the circuits and methods described above with respect to FIGS. 1-7, a bipolar device is provided that alternately applies at least one first current and a second current (comprised of multiple unit currents) to a first terminal of a bipolar device to produce a differential base-emitter voltage. A controller controls a plurality of current sources to selectively couple a selected one of the current sources to the first terminal, rotating through the current sources, one at a time, during a first phase of a modulator cycle to produce a relatively low current and a resulting low base-emitter voltage. The controller controls the plurality of current sources to couple multiple ones (such as all) of the current sources to the first terminal during a second phase of the modulator cycle. The controller alternates between one and all of the current sources to provide a time-varying current and a corresponding time-varying base-emitter voltage, which can be sampled to determine a differential base-emitter voltage that can be used to determine a temperature. In some exemplary embodiments, the base-emitter voltages can be sampled using a delta-sigma modulator, which produces an output signal that is provided to a back-end filter having a programmable impulse response that is used to filter the output signal. The filtered output signal is provided to temperature determination circuit 122 configured to determine a temperature.

Figure 8:
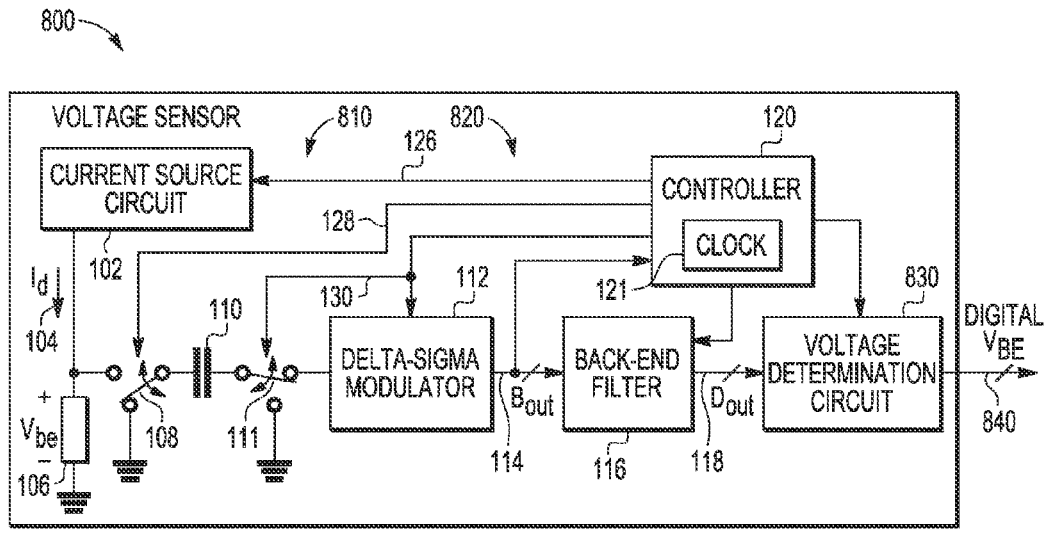
FIG. 8 illustrates a block diagram of a precision voltage sensor.

According to another aspect of the disclosure, FIG. 8 illustrates a block diagram of a precision voltage sensor 800. Precision voltage sensor 800 uses a similar architecture to temperature sensor 100 of FIG. 1, but replaces temperature determination circuit 122 of FIG. 1 with a voltage determination circuit 830. Precision voltage sensor 800 includes generally a sampler 810, an analog-to-digital converter 820, and voltage determination circuit 830. Sampler 810 includes current source circuit 102, bipolar device 106, switch 108, capacitor 110, and switch 111, interconnected and operating as described with reference to corresponding elements of FIG. 1 above. Sampler 810 samples voltages across bipolar device 106 to allow the development of a $\Delta V_{be}/V_{BE}$ ratio of a single bipolar device, thus avoiding the mismatch issue between two different bipolar devices described above.

Analog-to-digital converter 820 converts the sampled voltage to a digital value representative of the delta $\Delta V_{be}/V_{BE}$ ratio. Analog-to-digital converter 820 includes delta-sigma modulator 112 and back-end filter 116 to provide the $D_{out}$ signal as described with reference to corresponding elements of FIG. 1 above.

Voltage determination circuit 830 has a first input connected to the output of back-end filter 116, a second input connected to controller 120 for receiving a clock signal, and an output for providing a signal labeled "DIGITAL $V_{BE}$". DIGITAL $V_{BE}$ is a digital signal formed from $D_{out}$ as described below and is representative of the analog $V_{BE}$ of bipolar device 106.

In one embodiment, voltage determination circuit 830 is a polynomial machine configured to calculate the voltage based on the output of the back-end filter 116. In another embodiment, voltage determination circuit 830 includes a lookup table that is pre-populated with voltage values that can be retrieved based on the output of back-end filter 116 to determine the voltage. A user can measure $V_{BE}$ and $D_{out}$ in the laboratory for an ensemble of actual devices over the desired temperature range using precise measurement equipment. The user could then use the measurements to determine the polynomial coefficients (in the first embodiment) or the lookup table data values (in the second embodiment). Note that various techniques used to convert $D_{out}$ to temperature described above are applicable to converting $D_{out}$ to DIGITAL $V_{BE}$ as well.

Voltage sensor 800 is a voltage reference circuit that determines DIGITAL $V_{BE}$. This measurement is accurate over an operating temperature range, and can be used to form other values, such as a reference voltage which is stable over the operating temperature range, which will now be described.

Figure 9:
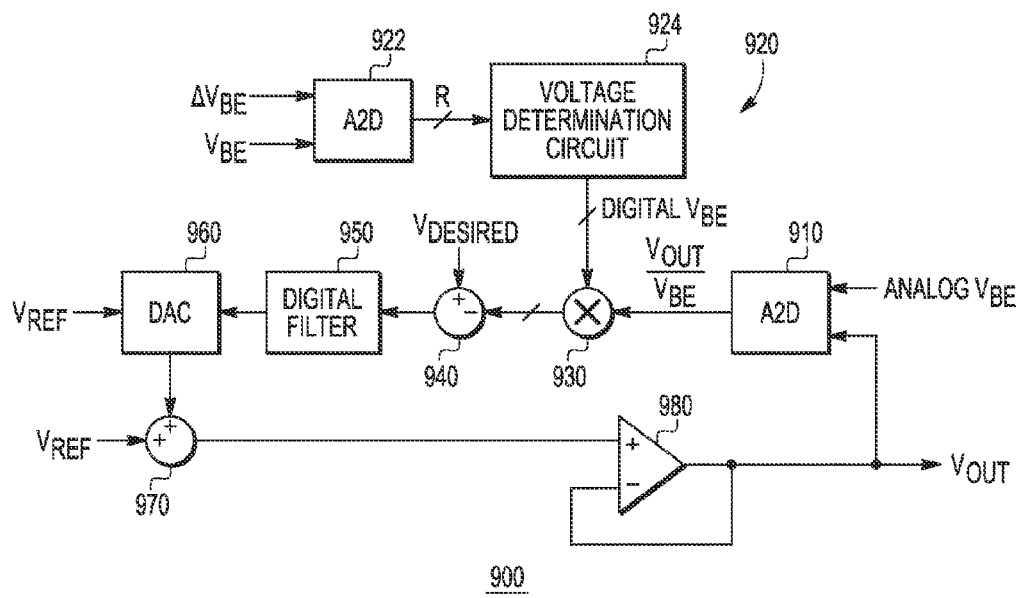
FIG. 9 illustrates a block diagram of a precision voltage reference based on the voltage sensor of FIG. 8.

FIG. 9 illustrates a block diagram of a precision voltage reference 900 based on precision voltage sensor 800 of FIG. 8. Precision voltage reference 900 includes generally an analog-to-digital converter labeled "A2D" 910, a voltage sensor 920, a multiplier 930, a summing device 940, a digital filter 950, a digital-to-analog converter ("DAC") 960, a summing device 970, and an operational amplifier 980. Analog-to-digital converter 910 has a first input for receiving an analog voltage labeled "ANALOG $V_{BE}$", a second input for receiving a voltage labeled "$V_{OUT}$", and an output for providing a signal labeled "$V_{OUT}/V_{BE}$". Precision voltage sensor 920 could be implemented by precision voltage sensor 800 of FIG. 8, and as shown has an analog-to-digital converter 922 corresponding to analog-to-digital converter 820 and a voltage determination circuit 924 corresponding to voltage determination circuit 830. Analog-to-digital converter 922 corresponds to analog-to-digital converter 820 and has a first input for receiving $\Delta V_{BE}$, a second input for receiving $V_{BE}$, and an output for providing a value labeled "R" that is equal to $\Delta V_{BE}/V_{BE}$. Voltage determination circuit 924 corresponds to voltage determination circuit 830 and has an input connected to the output of analog-to-digital converter 922, and an output for providing a signal labeled "DIGITAL $V_{BE}$". Multiplier 930 has a first input connected to the output of voltage determination circuit 924 for receiving the DIGITAL $V_{BE}$, a second input connected to the output of analog-to-digital converter 910, and an output. Summing device 940 has a positive input for receiving a signal labeled "$V_{DESIRED}$", a negative input connected the output of multiplier 930, and an output. Digital filter 950 has an input connected to the output of summing device 940, and an output. DAC 960 has an input connected to the output of digital filter 950, a second input for receiving a reference voltage labeled "$V_{REF}$", and an output. Summing device 970 has a first positive input for receiving $V_{REF}$, a second positive input connected the output of DAC 960, and an output. Operational amplifier 980 has a non-inverting input connected to the output of summing device 970, an inverting input, and an output connected to the inverting input thereof and to the second input of analog-to-digital converter 910 and providing signal $V_{OUT}$ thereon.

In operation, precision voltage reference 900 allows the development of a precise voltage $V_{OUT}$ that is temperature compensated. It uses precision voltage sensor 920 and an analog voltage reference whose output varies over a small range. Analog-to-digital converter 910 develops a digital value corresponding to the $V_{OUT}/V_{BE}$ ratio and provides this value to an input of multiplier 930. Multiplier 930 also receives the DIGITAL $V_{BE}$ from voltage determination circuit 924 such that the product of the two represents a precise digital representation of $V_{OUT}$. Summing device 940 then acts as an error amplifier to measure the deviation of $V_{OUT}$ from a desired level, namely $V_{DESIRED}$, which is the target or goal of precision voltage reference 900. Precision voltage reference 900 uses optional digital filter 950 to further smooth variations in the error voltage over time. Digital filter 950 operates as a digital lowpass filter and may be implemented with any of a variety of digital filter types, such as a finite impulse response (FIR) filter or a digital integrator (i.e., an accumulator). DAC 960 then converts the error voltage into an analog voltage using $V_{REF}$ as a reference level, which summing device 970 then adds to $V_{REF}$. Precision voltage reference 900 uses operational amplifier 980 in a unity-gain configuration, and thus buffers the output of summing device 970 from changes in the load driven by the output of precision voltage reference 900.

The closed loop feedback mechanism operates such that precision voltage reference 900 regulates $V_{OUT}$ to a value determined by $V_{DESIRED}$. $V_{DESIRED}$ is a digital value that can be programmed into the integrated circuit using, for example, fuses and thus the user can change $V_{DESIRED}$ as long as the difference between $V_{REF}$ and $V_{DESIRED}$ is less than the output range of DAC 960. $V_{REF}$ could be generated by another voltage reference, such as a traditional bandgap reference circuit.

Precision voltage reference 900 is able to achieve a stable output voltage over the operating temperature range. For example, if precision voltage reference 900 is implemented with a 90 nanometer (nm) CMOS manufacturing process available from a commercial foundry using parasitic bipolar transistors, it is able to generate $V_{OUT}$ at 1.2 V having an accuracy of within about ±1 mV over a temperature range of −40° C. to 125° C.

In another embodiment, $V_{OUT}$ can be made programmable by changing the configuration of operational amplifier 980, allowing the user to increase the range of achievable values of $V_{OUT}$ without increasing the range of DAC 960. For example, a resistor network could be used to scale $V_{OUT}$ to a different operating voltage.

In yet another embodiment, either or both of digital filter 950 and summing device 970 could be eliminated. In return for saving the circuit area used by digital filter 950 and/or summing device 970, however, $V_{OUT}$ would be less accurate and more noisy.

Figure 10:
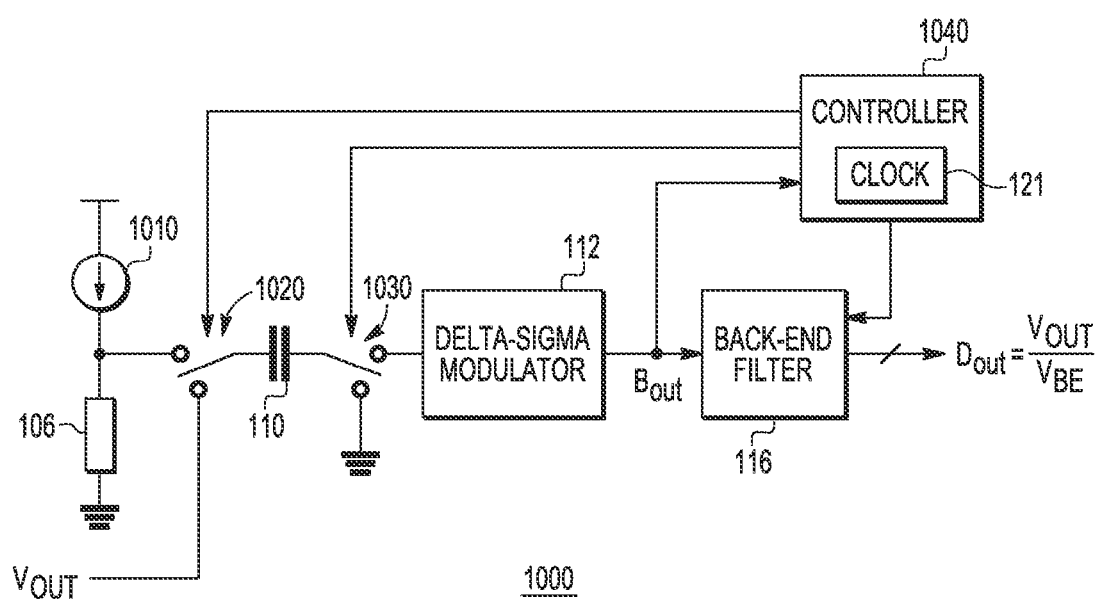
FIG. 10 illustrates a partial block diagram and partial schematic of an analog-to-digital converter suitable for use with the precision voltage reference of FIG. 9.

FIG. 10 illustrates a partial block diagram and partial schematic of an analog-to-digital converter 1000 suitable for use with precision voltage reference 900 of FIG. 9. Analog-to-digital converter 1000 includes a current source 1010, a switch 1020, a switch 1030, and a controller 1040 for use with bipolar device 106, capacitor 110, delta-sigma modulator 112, back-end filter 116, and clock 121 as described above. Current source 1010 has a first terminal connected to a power supply voltage terminal labeled "$V_{DD}$", and a second terminal connected to the first terminal of bipolar device 106. Switch 1020 has a first terminal connected to the first terminal of bipolar device 106, a second terminal for receiving $V_{OUT}$, a third terminal, and a control terminal for selectively switching either the first terminal or the second terminal to the third terminal. Capacitor 110 has a first terminal connected to the third terminal of switch 1020, and a second terminal. Switch 1030 has a first terminal connected to the second terminal of capacitor 110, a second terminal connected to the input terminal of delta-sigma modulator 112, a third terminal connected to ground, and a control terminal for selectively switching the first terminal to either the second terminal or the third terminal. Controller 1040 has an input terminal connected to the output terminal of delta-sigma modulator 112 for receiving Bout, a first output terminal connected to the control terminal of switch 1020, a second output terminal connected to the control terminal of switch 1030, and a third output for providing a clock signal to back-end filter 116.

In operation, analog-to-digital converter 1000 provides a digital output signal $D_{out}$ equal to the ratio of $V_{OUT}$ and the $V_{BE}$ of bipolar device 106. Since analog-to-digital converter 1000 uses the same bipolar device 106 that is used by precision voltage sensor 920, the output of multiplier 930 in FIG. 9 will precisely cancel $V_{BE}$, yielding an accurate digital representation of $V_{OUT}$ over the operating temperature. Switches 1020 and 1030 and capacitor 110 form a sampler which in one phase samples $V_{BE}$, in the next phase samples $V_{OUT}$, and then transfers the sampled voltage to the input of delta-sigma modulator 112.

In an alternate embodiment, analog-to-digital converter 1000 could reverse the connections between the first and second terminals of switch 1020 such that the output of analog-to-digital converter 1000 would provide $D_{out}$ as a ratio of $V_{BE}$ and $V_{OUT}$ instead. If this ratio were multiplied by $1/V_{BE}$, then the result would be $1/V_{OUT}$, and $V_{OUT}$ could be obtained by dividing one by the $1/V_{OUT}$ ratio. Generally, it is difficult to perform divide operations in digital circuitry. However two changes to the precision voltage sensor would eliminate the divide operations. The first change would be to determine and store a polynomial relationship between $\Delta V_{BE}/V_{BE}$ and $1/V_{BE}$ in voltage determination circuit 924, which would eliminate one division operation. Second, $1/V_{DESIRED}$ could be input to summing device 940. Since this change inverts the sense of the feedback, the signs of the inputs to summing device 940 also would be reversed.

Figures 11, 12:
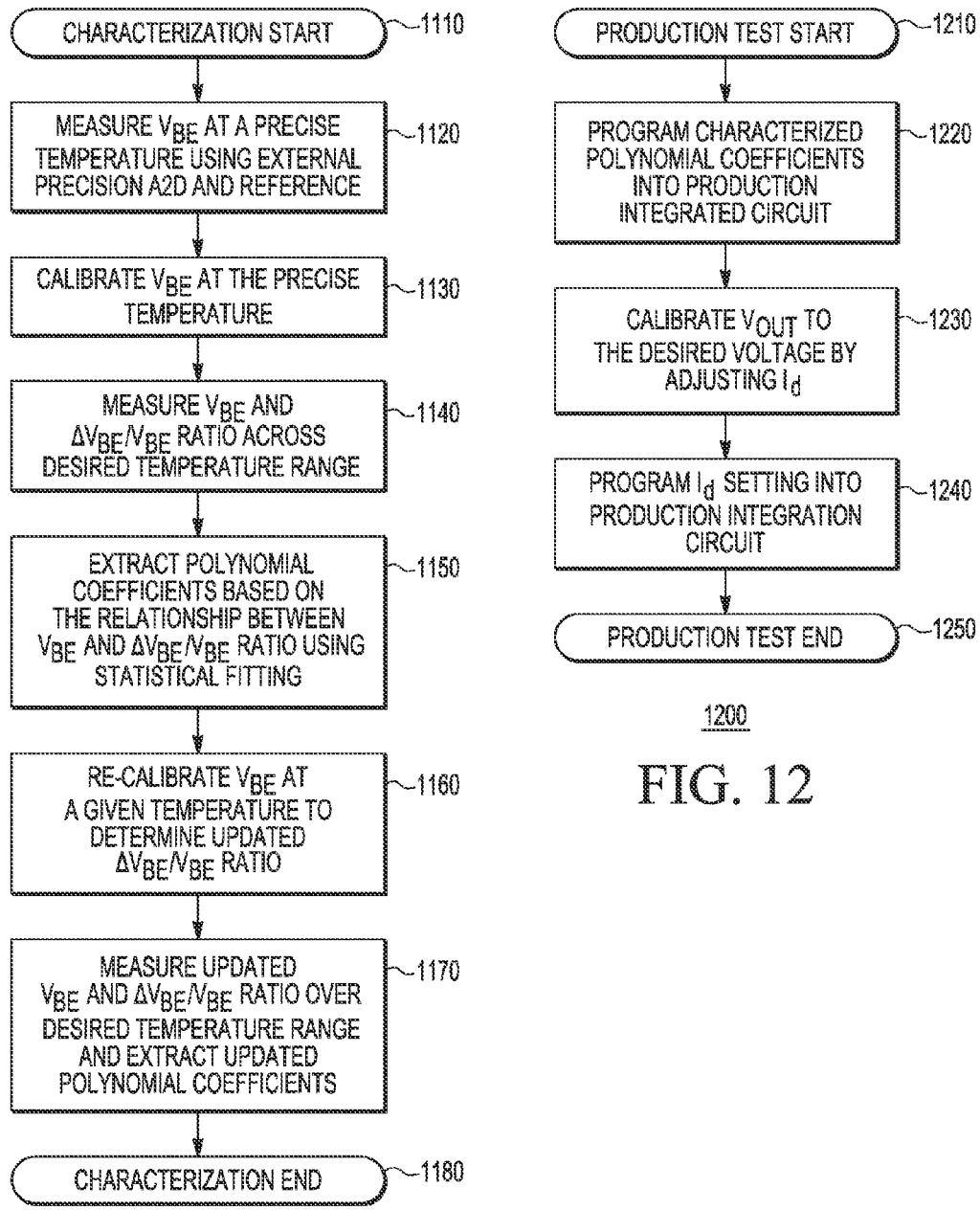
FIG. 11 illustrates a flow diagram of a method that can be used to characterize the precision voltage sensor design of FIG. 8.
FIG. 12 illustrates a flow diagram of a method that can be used to calibrate the precision voltage sensor of FIG. 8 in production.

FIG. 11 illustrates a flow diagram of a method 1100 that can be used to characterize the voltage sensor design of FIG. 8. Method 1100 starts at box 1110. Boxes 1120-1170 are performed for multiple integrated circuits. At box 1120, $V_{BE}$ is measured at a precise temperature, such as 25° C., using an external precision analog-to-digital converter and external voltage reference. At box 1130, $V_{BE}$ is calibrated to a predetermined value at the precise temperature by, for example, adjusting the collector current in bipolar device 106. Then at box 1140, $V_{BE}$ and the $\Delta V_{BE}/V_{BE}$ ratio are measured across the desired temperature range. For example, the desired temperature range could be 0° C. to 70° C., or alternatively from −40° C. to 125° C. for an extended temperature range. At box 1150, polynomial coefficients are extracted based on the relationship between $V_{BE}$ and $\Delta V_{BE}/V_{BE}$ using statistical fitting. At this point, the accuracy of relationship may be sufficient. However to improve the accuracy, method 1100 includes additional steps that are performed to determine updated polynomial coefficients for each integrated circuit. At action box 1160 $V_{BE}$ is re-calibrated at a given temperature to match the $\Delta V_{BE}/V_{BE}$ ratio reported by the integrated circuit based on the relationship developed in box 1150. Then at box 1170, $V_{BE}$ and the $\Delta V_{BE}/V_{BE}$ ratio are measured over the desired temperature range, and updated polynomial coefficients are extracted based on the relationship between $V_{BE}$ and $\Delta V_{BE}/V_{BE}$ using statistical fitting. Method 1100 ends at box 1180.

FIG. 12 illustrates a flow diagram of a method 1200 that can be used to calibrate the voltage sensor of FIG. 8 in production. In other embodiments, however, method 1200 could be performed on a production integrated circuit in the field, i.e. after factory test. Method 1200 starts at box 1210. At box 1220, the characterized polynomial coefficients characterized using, for example, method 1100 are programmed into the production integrated circuit. At box 1230, $V_{OUT}$ is calibrated to the desired value by adjusting Id. Then at box 1240, the $I_d$ setting is programmed into the production integrated circuit. Method 1200 ends at box 1250.

By both characterizing transistor characteristics using method 1100 and adjusting $I_d$ on each particular integrated circuit being produced, voltage determination circuit 830 can provide $V_{BE}$ values that are accurate across the desired temperature range.

Figure 13:
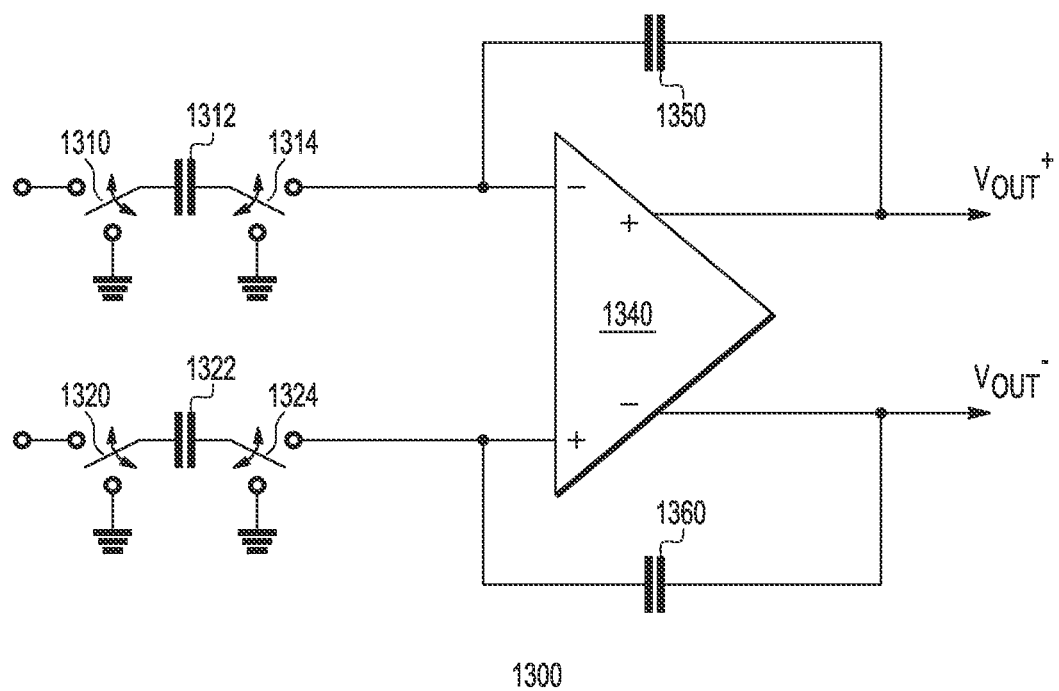
FIG. 13 illustrates in partial block diagram and partial schematic form a differential sampler that can be used in the temperature sensor of FIG. 1 or the voltage sensor of FIG. 8.

FIG. 13 illustrates in partial block diagram and partial schematic form a differential sampler 1300 that can be used in temperature sensor 100 of FIG. 1 or precision voltage sensor 800 of FIG. 8. Differential sampler 1300 includes a switch 1310, a capacitor 1312, switches 1314 and 1320, a capacitor 1322, a switch 1324, an operational amplifier 1340, a capacitor 1350, and a capacitor 1360. Switch 1310 has a first terminal connected to a first terminal of bipolar device 106 (not shown in FIG. 13), a second terminal connected to ground, and a third terminal, and connects its third terminal to either its first terminal or its second terminal according to a control signal from controller 120 as described above. Capacitor 1312 has a first terminal connected to the third terminal of switch 1310, and a second terminal. Switch 1314 has a first terminal connected to the second terminal of capacitor 1312, a second terminal connected to ground, and a third terminal, and connects its first terminal to either its second terminal or its third terminal according to a control signal from controller 120 as described above. Switch 1320 has a first terminal connected to a first terminal of another bipolar device as will be explained below, a second terminal connected to ground, and a third terminal, and connects its third terminal to either its first terminal or its second terminal according to a control signal from controller 120 as described below. Capacitor 1322 has a first terminal connected to the third terminal of switch 1320, and a second terminal. Switch 1324 has a first terminal connected to the second terminal of capacitor 1322, a second terminal connected to ground, and a third terminal, and connects its first terminal to either its second terminal or its third terminal according to a control signal from controller 120 as described below.

Operational amplifier 1340 has an inverting input terminal connected to the third terminal of switch 1314, a non-inverting input terminal connected to the third terminal of switch 1324, a non-inverting output terminal that provides a signal labeled "$V_{OUT}+$", and an inverting output terminal that provides a signal labeled "$V_{OUT}-$". Capacitor 1350 has a first terminal connected to the third terminal of switch 1314, and a second terminal connected to the non-inverting output terminal of operational amplifier 1340. Capacitor 1360 has a first terminal connected to the third terminal of switch 1324, and a second terminal connected to the inverting output terminal of operational amplifier 1340.

In operation, controller 120 controls switches 1310 (corresponding to switch 108) and 1314 (corresponding to switch 111) and the amount of current in current source circuit 102 as described with reference to FIG. 1 to develop an output D that over time is equal to $(V_2-V_1)/V_2$ (namely $\Delta V_{BE}/V_{BE}$), as described in equations (3)-(5) above.

Differential sampler 1300 uses this technique to develop the same quantity using a second bipolar device 106' corresponding to bipolar device 106 that it samples simultaneously with bipolar device 106. Bipolar device 106' is connected to the first terminal of switch 1320 and is sampled during the first modulator cycle as shown in Table 2.

TABLE 2

Switching States of Switched Capacitor 1322 during a modulator cycle.
Switching States during each modulator cycle

| | Phase 1 | Phase 2 |
|---|---|---|
| Unit Current Source(s) | Total Unit Currents ($I_{1\text{-}16}$) | $I_i$ of 16 unit currents (I) |
| Switch 1324 | Provide Capacitor Charge to Modulator | Ground |
| Switch 1320 | If $B_{out}$ 114 = 0, then $V_2$<br>If $B_{out}$ 114 = 1, then ground | $V_1$ |

As shown in Table 2, during the first phase of the first modulator cycle, controller 120 controls a second current source circuit 102' corresponding to current source circuit 102 to provide the total of the unit currents ($I_{1\text{-}16}$) to the first terminal of bipolar device 106'. Controller 120 controls switch 1320 to remain coupled to the first terminal of bipolar device 106' to receive the second voltage ($V_2$) if the output of modulator 112 from the previous modulator cycle ($B_{out}$) was a zero (0). If the output of modulator 112 from the previous modulator cycle was a one (1), controller 120 controls switch 1320 to couple to ground. Controller 120 controls switch 1324 to provide capacitor charge to the integrator. During the second phase of the modulator cycle, controller 120 controls current source circuit 102' to provide a single unit current ($I_i$) from a selected one of the unit current sources to the first terminal of bipolar device 106'. Controller 120 controls switch 1320 to couple to the first terminal of bipolar device 106' and controls switch 1324 to couple to ground. Thus, controller 120 controls the switching on the second input as if Phase 1 and Phase 2 were reversed compared to the first input.

In the next modulator cycle, during the first phase, controller 120 causes current source circuit 102 to provide the total of the unit currents while causing current source circuit 102' to provide a single unit current ($I_i$) from a selected one of the unit current sources. Also controller 120 causes switch 1310 to select either $V_2$ or ground based on the state of $B_{out}$, while causing switch 1320 to select $V_1$. During the second phase, controller 120 causes first current source circuit to provide a single unit current ($I_i$) from a selected one of the unit current sources while causing current source circuit 102' to provide the total of the unit currents. During the second phase, switch 1310 selects $V_1$ and switch 1320 selects $V_2$ or ground depending on the previous $B_{out}$. Thus in the second modulator cycle, the controls are reversed compared to the first modulator cycle on each input and the first input is controlled in the manner that the second input was controlled in the first cycle, and the second input is controlled in the manner that the first input was controlled in the first cycle. This pattern repeats during the successive modulator cycles. In this manner, the use of differential sampler 1300 reduces the sensitivity to direct current (DC) offsets in the same way as described above, but adds 6 dB to the signal-to-noise ratio.

Figure 14:
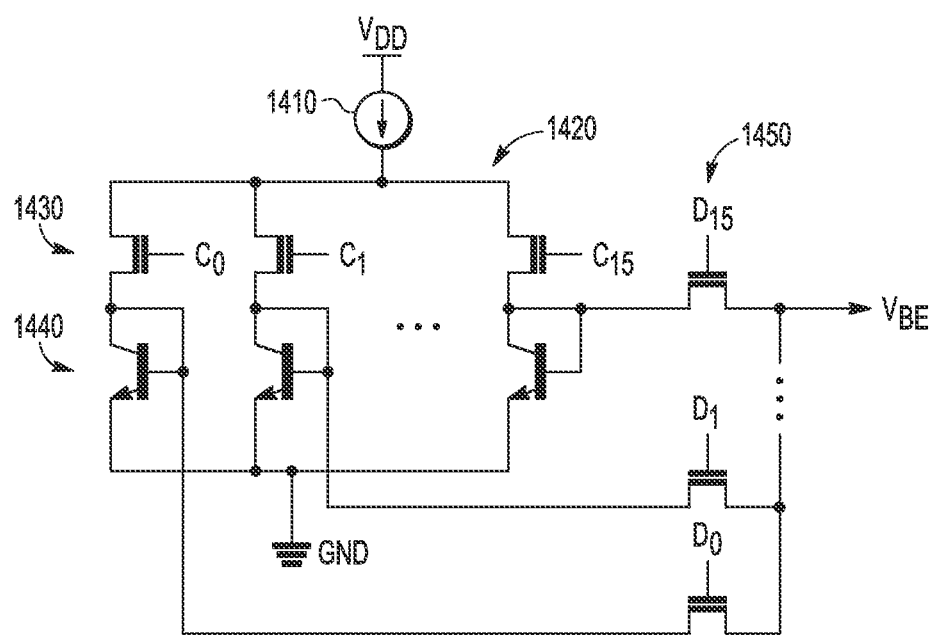
FIG. 14 illustrates in schematic form a portion of an alternate $V_{BE}$ measurement circuit that can be used in the temperature sensor of FIG. 1 or the voltage sensor of FIG. 8.

FIG. 14 illustrates in schematic form a portion 1400 of an alternate $V_{BE}$ measurement circuit that can be used in temperature sensor 100 of FIG. 1 or precision voltage sensor 800 of FIG. 8. Portion 1400 corresponds to current source circuit 102 and bipolar device 106 as shown in FIGS. 1 and 8 and includes a current source 1410 and a bipolar device switching section forming a composite bipolar device 1420. Current source 1410 has a first terminal connected to $V_{DD}$, and a second terminal. Composite bipolar device 1420 includes a set of switches 1430 implemented as N-channel transistors, a set of bipolar transistors 1440, and a set of switches 1450 implemented as N-channel transistors. However other types of devices may be used in other embodiments, by making modifications to the embodiment illustrated, as persons of ordinary skill in the art understand. Each transistor in set 1430 includes a first terminal connected to the second terminal of current source 1410, and a second terminal connected to a collector of a corresponding transistor in set 1440, and is controlled by a corresponding one of a set of control signals labeled "$C_0$", "$C_1$", etc. through "$C_{15}$". Each bipolar transistor in set 1440 has a base connected to the collector thereof, and an emitter connected to ground. Each transistor in set 1450 has a first terminal connected to the collector of a corresponding bipolar transistor, a second terminal connected to an output terminal of portion 1400, and is controlled by a corresponding one of a set of control signals labeled "$D_0$", "$D_1$", etc. through "$D_{15}$".

Instead of varying current provided by a current source like current source 102 of FIGS. 1 and 8, controller 120 varies the number of bipolar transistor slices used to form a variable emitter area of composite bipolar device 1420. As with the currents used in current source circuit 102, controller 120 can rotate the active slice when generating $V_1$ to average any mismatches that might exist in the layout and characteristics of the transistors in composite bipolar device 1420.

Although the present invention has been described with reference to preferred embodiments, workers skilled in the art will recognize that changes may be made in form and detail without departing from the scope of the invention.

What is claimed is:

1. A reference circuit comprising:
    a measurement circuit having an output for providing a ratio of a difference in base-to-emitter voltage ($V_{BE}$) of a bipolar device at first and second current densities to a $V_{BE}$ of the bipolar device at one of the first and second current densities; and
    a determination circuit having an input coupled to the output of the measurement circuit, and an output for providing a digital value of a parameter in response to the ratio.

2. The reference circuit of claim 1, wherein the parameter is a temperature.

3. The reference circuit of claim 1, wherein the parameter is a voltage.

4. The reference circuit of claim 3, further comprising:
    a voltage generation circuit having an input coupled to the output of the determination circuit, and an output, for modulating an analog voltage using the digital value to provide a reference voltage to the output, wherein the reference voltage is temperature compensated over a temperature range.

5. The reference circuit of claim 1, wherein the measurement circuit further comprises:
    a sampler for alternately coupling a first terminal of a capacitor between a first terminal of the bipolar device and a reference voltage terminal in response to a first control signal, and coupling a second terminal of the capacitor between an output terminal of the sampler and the reference voltage terminal in response to a second control signal; and
    an analog-to-digital converter having an input coupled to the output terminal of the sampler, and an output, wherein the measurement circuit provides the ratio in response to the output of the analog-to-digital converter.

6. The reference circuit of claim 5, further comprising:
a controller having a first output for providing the first control signal, and a second output for providing the second control signal.

7. The reference circuit of claim 5, wherein the analog-to-digital converter further comprises:
a modulator having an input coupled to the output of the sampler, and an output; and
a filter having an input coupled to the output of the modulator, and an output for providing the ratio.

8. The reference circuit of claim 5, wherein the sampler and the analog-to-digital converter have a differential architecture.

9. The reference circuit of claim 1, wherein the measurement circuit measures the difference in $V_{BE}$ of the bipolar device at the first and second current densities by varying a current through the bipolar device.

10. The reference circuit of claim 1, wherein the measurement circuit measures the difference in $V_{BE}$ of the bipolar device at the first and second current densities by conducting a fixed current through a composite bipolar device having a variable emitter area.

11. A voltage reference comprising:
a first analog-to-digital converter having a first input, a second input for receiving an analog base-to-emitter voltage ($V_{BE}$), and an output;
a voltage sensor for providing a digital signal representing a digital $V_{BE}$ of a bipolar device;
a multiplier having a first input coupled to the output of the first analog-to-digital converter, a second input for receiving the digital signal, and an output;
a first summing device having a first input coupled to the output of the multiplier, a second input for receiving a desired voltage, and an output;
a digital-to-analog converter having a first input coupled to the output of the first summing device, and an output; and
a buffer having an input coupled to the output of the digital-to-analog converter, and an output for providing an output voltage coupled to the first input of the first analog-to-digital converter.

12. The voltage reference of claim 11, wherein the voltage sensor comprises:
a second analog-to-digital converter having an output for providing a ratio representative of a difference in $V_{BE}$ ($\Delta V_{BE}$) of the bipolar device at two current densities and a $V_{BE}$ of the bipolar device at a first current density; and
a voltage determination circuit having an input for receiving the ratio and an output for providing the digital signal, wherein the voltage determination circuit adjusts the ratio according to characterization data of at least one integrated circuit.

13. The voltage reference of claim 11, wherein the voltage sensor comprises:
a modulator including an input coupled to a first terminal of the bipolar device, and an output for providing a modulator output signal;
a filter having an input coupled to the output of the modulator and an output, the filter configured to convolve the modulator output signal with an impulse response to provide a filtered signal to the output of the filter; and
a voltage determination circuit having an input coupled to the output of the filter and an output for providing a voltage in response to the filtered signal.

14. A method comprising:
alternately operating a bipolar device at a first current density and at a second current density;
measuring a first base-to-emitter voltage ($V_{BE}$) of the bipolar device at the first current density and a second $V_{BE}$ at the second current density;
converting to a digital signal a ratio of a difference between the first $V_{BE}$ and the second $V_{BE}$ divided by one of the first $V_{BE}$ and the second $V_{BE}$; and
converting the digital signal to a parameter in response to the digital signal.

15. The method of claim 14, wherein converting the digital signal to the parameter comprises converting the digital signal to a temperature value.

16. The method of claim 14, wherein converting the digital signal to the parameter comprises converting the digital signal to a digital voltage.

17. The method of claim 14, wherein converting the digital signal to the parameter comprises converting the digital signal to the parameter according to a polynomial.

18. The method of claim 17, wherein converting the digital signal to the parameter according to the polynomial comprises characterizing a plurality of integrated circuits to obtain coefficients for the polynomial.

19. The method of claim 18, wherein characterizing the plurality of integrated circuits to obtain coefficients for the polynomial comprises:
for each of the plurality of integrated circuits:
measuring a $V_{BE}$ using an external reference at a predetermined temperature;
calibrating the $V_{BE}$ at the predetermined temperature; and
measuring the $V_{BE}$ and the ratio for each of the plurality of integrated circuits across a desired temperature range, and
extracting polynomial coefficients based on a relationship between the $V_{BE}$ and the ratio for the plurality of integrated circuits.

20. The method of claim 18, further comprising:
programming coefficients of the polynomial into a production integrated circuit;
calibrating an output voltage to a desired voltage by adjusting a current; and
programming the current into the production integrated circuit in response to the calibrating.

* * * * *